(12) United States Patent
Borngräber (10) Patent No.: US 9,861,017 B2
(45) Date of Patent: Jan. 2, 2018

(54) METHOD AND SHIELDING UNITS FOR INDUCTIVE ENERGY COILS

(75) Inventor: Frank Borngräber, Weissenhorn (DE)

(73) Assignee: Nokia Technologies Oy, Espoo (FI)

(*) Notice: Subject to any disclaimer, the term of this patent is extended or adjusted under 35 U.S.C. 154(b) by 479 days.

(21) Appl. No.: 14/370,834

(22) PCT Filed: Jan. 16, 2012

(86) PCT No.: PCT/FI2012/050032
§ 371 (c)(1),
(2), (4) Date: Jul. 7, 2014

(87) PCT Pub. No.: WO2013/107920
PCT Pub. Date: Jul. 25, 2013

(65) Prior Publication Data
US 2015/0022020 A1    Jan. 22, 2015

(51) Int. Cl.
*H05K 9/00* (2006.01)
*H01F 38/14* (2006.01)
*H02J 7/02* (2016.01)
*H02J 5/00* (2016.01)

(52) U.S. Cl.
CPC ........... *H05K 9/0007* (2013.01); *H01F 38/14* (2013.01); *H02J 5/005* (2013.01); *H02J 7/025* (2013.01)

(58) Field of Classification Search
CPC ........ H05K 9/0007; H02J 5/005; H02J 7/025; H02J 17/00; H01F 38/14; H01B 19/02
USPC ..................................................... 307/104
See application file for complete search history.

(56) References Cited

U.S. PATENT DOCUMENTS

| 5,658,482 A * | 8/1997 | Gaspard | H05B 6/1245 |
| | | | 174/362 |
| 6,110,563 A | 8/2000 | Pienimaa et al. | |
| 2009/0096413 A1* | 4/2009 | Partovi | H01F 5/003 |
| | | | 320/108 |
| 2010/0065352 A1* | 3/2010 | Ichikawa | B60L 11/182 |
| | | | 180/65.8 |
| 2010/0156343 A1 | 6/2010 | Jung | |
| 2010/0181842 A1* | 7/2010 | Suzuki | H02J 5/005 |
| | | | 307/104 |

(Continued)

FOREIGN PATENT DOCUMENTS

| EP | 2172952 | 4/2010 |
| KR | 100821885 | 4/2008 |

OTHER PUBLICATIONS

International Search Report and Written Opinion received for corresponding Patent Cooperation Treaty Application No. PCT/FI2012/050032 , dated Sep. 18, 2012, 13 pages.

*Primary Examiner* — Jared Fureman
*Assistant Examiner* — Win Htun
(74) *Attorney, Agent, or Firm* — Harrington & Smith (57) ABSTRACT

The invention relates to protecting metals and components from inductive energy. The protecting apparatus comprises an inductive energy coil (51), a first shielding unit comprising an opening (58) around the inductive energy coil (51) wherein the first shielding unit (54) is located in parallel to inductive energy coil (51); and a second shielding unit (53) under the inductive energy coil (51) so that the inductive energy coil (51) is enabled for electromagnetic radiation. The invention further relates to a method for producing the protecting apparatus and an electronic device comprising the protecting apparatus.

20 Claims, 5 Drawing Sheets

(56) References Cited

U.S. PATENT DOCUMENTS

| | | | |
|---|---|---|---|
| 2010/0244582 A1* | 9/2010 | Yoshikawa | H02J 5/005 307/104 |
| 2010/0320843 A1* | 12/2010 | Kitamura | H01F 27/34 307/104 |
| 2011/0050164 A1* | 3/2011 | Partovi | H01F 5/003 320/108 |
| 2011/0084655 A1* | 4/2011 | Hui | H02J 7/025 320/108 |

* cited by examiner

METHOD AND SHIELDING UNITS FOR INDUCTIVE ENERGY COILS

RELATED APPLICATION

This application was originally filed as PCT Application No. PCT/FI2012/050032 filed Jan. 16, 2012.

BACKGROUND

Inductive charging uses an electromagnetic field to transfer energy wirelessly between two objects, for example, between a charging station and a portable electrical device. Energy is transmitted through inductive coupling from the charging station to the device, which may use that energy to charge batteries. Inductive charging enables the user of the device to charge batteries without wires between the two devices. Induction charger typically uses an induction coil to create an alternating electromagnetic field within the charging station, and the induction coil in the device receives power from the magnetic field and converts it into electrical current to charge the battery. The two induction coils in proximity combine to form an electrical transformer.

However, the magnetic field can interact or interfere with other components or friendly metals inside the device exposed to the magnetic field; for example, semiconductor or discrete components may be damaged. The interference may be caused by heat generated by eddy currents or by high power level.

SUMMARY

The present invention relates to an apparatus for shielding i.e. protecting metals and components inside an apparatus in wireless power transfer applications, wherein metals and components belong to functions and functionality of the apparatus.

Various aspects of the invention include an apparatus for shielding, a device comprising the apparatus for shielding and a method for producing the apparatus, which are characterized by what is stated in the independent claims. Various embodiments of the invention are disclosed in the dependent claims.

An apparatus for shielding, protecting and/or field forming may be any additional shield or field forming element arranged around the inductive energy receiving coil or on the opposite side of the active area of the inductive energy transmission coil, wherein the active area of the inductive energy coil is on that side of the inductive energy coil where it is arranged to receive and/or transmit inductive energy.

A device, comprising an apparatus for shielding, may be a mobile device, a portable device or other any other device suitable to receive energy using/by inductive coupling i.e. inductive energy link. The device may be, for example, a mobile phone, a mobile computer, a mobile collaboration device, a mobile internet device, a smart phone, a tablet computer, a tablet personal computer (PC), a personal digital assistant, a handheld game console, a portable media player, a digital still camera (DSC), a digital video camera (DVC or digital camcorder), a pager, or a personal navigation device (PND).

The term "inductive energy coil" or "inductive energy transceiver coil" here refers to a coil i.e. a coil that is used to receive and/or transmit inductive energy wirelessly. The term "inductive energy receiver coil" here refers to a receiver coil i.e. a coil that is used to receive electromagnetic energy wirelessly. The term "inductive energy transmitter coil" here refers to a transmitter coil i.e. a coil that is used to transmit electromagnetic energy to the inductive energy receiver coil wirelessly.

According to a first aspect of the invention, there is provided an apparatus comprising an inductive energy coil for inductive energy transmission, a first shielding unit comprising an opening, wherein the first shielding unit is located in parallel to inductive energy coil, and wherein the opening of the first shielding unit is arranged to be located so that the opening at least partially reveals the inductive energy coil electromagnetic radiation and a second shielding unit, wherein the second shielding unit is located in parallel to the inductive energy coil so that the inductive energy coil is enabled for electromagnetic radiation.

According to an embodiment, the inductive energy coil is an inductive energy receiver coil. According to an embodiment, the inductive energy coil is an inductive energy transmitter coil. According to an embodiment, the inductive energy coil is an inductive energy transceiver coil. According to an embodiment, the first shielding unit has plurality of openings. According to an embodiment, the apparatus further comprises at least one further shielding unit with at least one opening, wherein said at least one further shielding unit is in parallel to the first shielding unit. According to an embodiment, the first shielding unit is in-molded into a cover of the device. According to an embodiment, the first shielding unit is attached to a cover of the device. According to an embodiment, the first shielding unit is attached to the back side of the cover of the device. According to an embodiment, the first shielding unit is attached to the front side of the cover of the device. According to an embodiment, the apparatus is a part of an electronic device.

According to a second aspect of the invention, there is provided an apparatus comprising means for protecting the area around an inductive energy transmission coil from electromagnetic energy, wherein the means for protecting comprises an opening and wherein the opening is arranged to be located so that it at least partially reveals the inductive energy coil for inductive energy transmission.

According to a third aspect of the invention, there is provided a method comprising: locating a first shielding unit comprising an opening in parallel to inductive energy coil, and wherein the opening of the first shielding unit is arranged to be located so that the opening at least partially reveals inductive energy coil for electromagnetic radiation, and locating the second shielding unit in parallel to the inductive energy coil so that the inductive energy coil is enabled for electromagnetic radiation.

According to an embodiment, the inductive energy coil is an inductive energy receiver coil. According to an embodiment, the inductive energy coil is an inductive energy transmitter coil. According to an embodiment, the inductive energy coil is an inductive energy transceiver coil. According to an embodiment, the first shielding unit has plurality of openings. According to an embodiment, the method further comprises locating at least one further shielding unit with at least one opening in parallel to the first shielding unit. According to an embodiment, the method comprises in-molding the first shielding unit into a cover of the device. According to an embodiment, the method comprises attaching the first shielding unit to a cover of the device. According to an embodiment, the method comprises attaching the first shielding unit to the back side of the cover of the device. According to an embodiment, the method comprises attaching the first shielding unit to the front side of the cover of the device.

DESCRIPTION OF THE DRAWINGS

In the following, various embodiments of the invention will be described in more detail with reference to the appended drawings, in which.

DETAILED DESCRIPTION OF THE EMBODIMENTS

In the following, several embodiments of the invention will be described in the context of an apparatus for shielding and/or field forming for a device, for example, a mobile device, for wireless charging or wireless energy transmission. It is to be noted, however, that the invention is not limited to mobile devices only. In fact, the different embodiments may have applications widely in any environment where additional shielding for a device to be charged is needed during wireless charging or inductive-based energy transmission is required.

Usually in wireless energy transmission systems using inductive-based energy transfer the shielding of a coil is slightly larger than the physical size of the coil For example, the diameter of circular shield may be 2 mm larger than the diameter of circular coil. The reason for using the shielding may be to form a field and to keep it between the shields of the transmitter, receiver and/or transceiver so that materials and components inside an apparatus, i.e. inside the apparatus that is arranged to receive or transmit inductive energy wirelessly, are not damaged or interfered, wherein interferences or damages may be caused by heat generated by eddy currents or by high power levels during wireless energy transmission.

Figure 1:
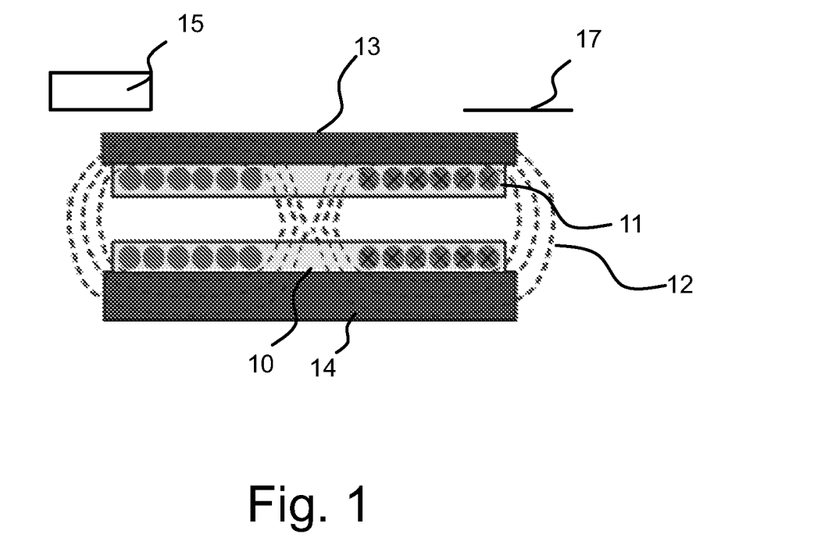
FIG. 1 shows a form of magnetic field formed between coils with the same shape and size during wireless charging according to an example embodiment.

FIG. 1 shows a form of magnetic field formed between coils with the same shape and size during wireless charging according to an example embodiment. Since a transmitter coil 10 and a receiver coil 11 have the same shape and size may the formed magnetic field 12 be homogeneous. A shield 13 of the receiver coil 11 may be arranged for the coil 11 so that the shield 13 is on the side of the receiver coil 11 that is not arranged for inductive energy transmission. The shield 13 may have any form i.e. the form of the shield 13 is not restricted to circular. There may also be a transmitter shield 14 on the side of the transmitter coil 10 that is not arranged for inductive energy transmission. As can be seen from FIG. 1, due to the same size and shape of coils 10 and 11 and the shield 13 the magnetic field 12 will not extend i.e. reach to a component 15 or metal 17 of the mobile device and thus the field will not damage or interfere the component 15 or metal 17.

Figure 2:
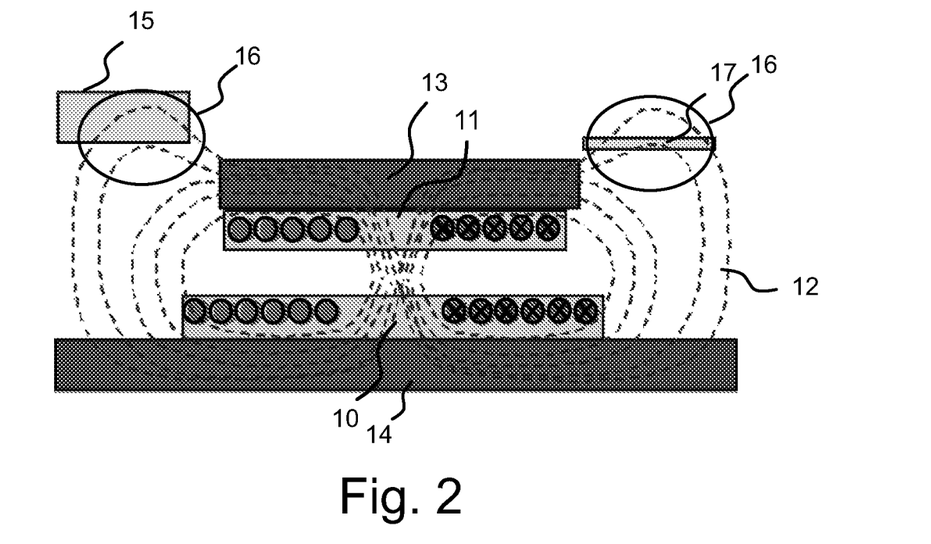
FIG. 2 shows a form of magnetic field formed between coils with different shape and/or size during wireless charging according to an example embodiment.

However, if the size of the inductive energy receiver coil is smaller than the inductive energy transmitter coil and/or the shape of the inductive energy receiver coil differs from the inductive energy transmitter coil, the field may differ from homogenous and may penetrate an area around the inductive energy receiver coil. An example, where the receiver coil 11 is smaller than the transmitter coil 10 is disclosed in FIG. 2. The size of formed penetrated area 16 around the receiver coil 11 may depend on the power emitted by the transmitter coil 10. Inside the penetrated area 16 the component 15 and/or metal 17 may be interfered or damaged due to exposure to the magnetic field 12. The influence to the component 15 and/or metal 17 may depend on strength of electromagnetic energy of formed field. The receiver shield 13 may be ferromagnetic material, for example, ferrite or any other material suitable for protecting materials and components from magnetic field. The magnetic field may be caused by inductive charging.

Figure 3:
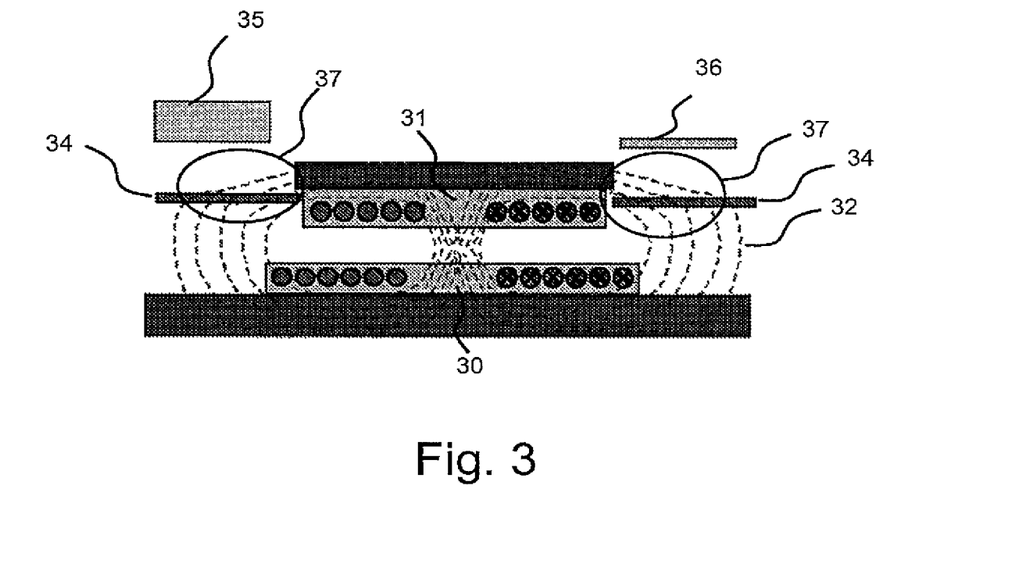
FIG. 3 shows a form of magnetic field formed between coils with different dimensions and with an additional shield during wireless charging according to an example embodiment.

FIG. 3 shows a form of magnetic field formed between coils 31 and 30 with different size during wireless charging according to an example embodiment, wherein the structures of coils and shielding are disclosed in cross section view. The size of an inductive energy transmitter coil 30 is larger than the size of an inductive energy receiver coil 31. Due to this difference between the sizes of coils 30 and 31 the field 32 will differ from homogenous field and a penetrated area 37 is formed around the receiver coil 31. An additional shield 34 is formed around the receiver coil 31 as shown in FIG. 4, the magnetic field 32 will not penetrate into component 35, metal 36 or any other component or material or element (not shown) around the receiver coil 31 or at least the magnetic field 32 interferes less the component 35, metal 36 or any other component or material or element (not shown) around the receiver coil 31.

The additional shield 34 may be made of non metal material which is magnetically conductive and electrically non-conductive material suitable for protecting components and materials from magnetic field and forming magnetic field, for example, ferrite materials, Mu-Metals (Permalloy) or materials with a high enough permeability. The size of the additional shield 34 may be arranged so large that it is suitable for covering all components and/or materials around the receiver coil 31 and/or larger than typically used inductive energy transmitter coils.

Figure 4:
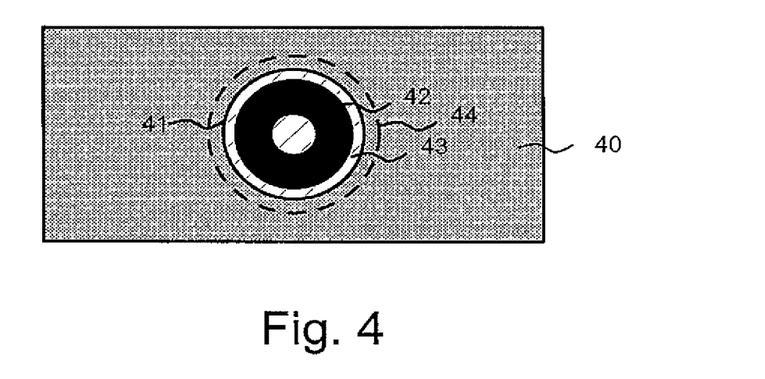
FIG. 4 shows a top view of a structure of an additional shield for a mobile device according to an example embodiment.

FIG. 4 shows a top view of a structure of an inductive energy receiver coil 42 with an additional shield 40 and a receiver shield 43 for a device according to an example embodiment. The shape of the additional shield 40 is rectangular; however, it may have any other suitable shape, for example, a shape of a battery cover of a device or circular, elliptical, rectangular or square. In addition, the size of the additional shield 40 may depend on, for example, the shape and/or dimensions of a place into which it is arranged to be located in a device and/or the size may depend on the properties of the device i.e. location and/or type of components and materials a mobile device. There is an opening 41 for the receiver coil 42 in the additional shield 40. The opening 41 may be, for example, circular. However the shape of the opening 41 in the additional shield 40 is not restricted, it is only preferred that the opening 41 is formed so that the opening 41 and the receiver shield 43 under the receiver coil 42 are one on the other so that the opening 41 reveals the receiver coil 42 for receiving inductive energy. The receiver shield 43 and the additional shield 40 may be in parallel and they may at least partially overlap when seen from the direction the device is arranged to be charged. This can be seen from FIG. 4, wherein a borderline of the receiver shield 43 is shown as a dash line 44. Thus, no magnetic field may penetrate around the receiver coil 42. However, it is also possible that the additional shield 40 is arranged to the other side of the receiver shield 43 i.e. under the receiver shield 43 when seen from the direction the receiver coil 42 is arranged to receive inductive energy. In which case the shields 40 and 43 still overlap. In addition, it is possible that the opening 41 reveals the receiver coil 42 only partially.

The additional shield may make the shielding of the device better and thus may improve the protection whatever component or metal inside the device that could otherwise be exposed and interfered with the magnetic field. Because of this additional shield, the inductive energy receiver coil, inductive energy transceiver coil, and also the inductive energy transmitter coil may have whatever size or shape and the protection of the inside components of the device against magnetic and/or inductive fields may be improved.

The additional shield with the opening may be in-molded into a cover, for example, into the battery cover or back cover of a device. Alternatively, the additional shield with the opening may be attached to the inner or outer side of the cover. Attaching may be done by gluing. The additional shield may have any shape suitable for the device. The shape may be for example rectangular, square, circular or elliptical.

The additional shield provides protection for inner device components and materials against magnetic and/or inductive fields. In addition, use of the additional shield may make it easier to design coils, because they can be designed so that the size or shape of other inductive energy transmission coils does not have to be taken into account. Further, a magnetic field may be formed by selection of material of the additional shield. The additional shield may be ferromagnetic material, for example, ferrite or any other material suitable for shielding materials i.e. metals and components inside the mobile device, and in addition for forming the magnetic field when needed.

Figure 5A:
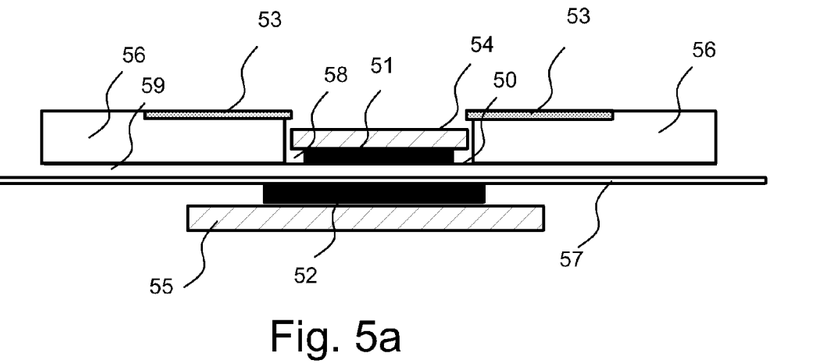
FIG. 5a shows a cross section view of inductive energy transferring coils and surroundings according to an example embodiment.

FIG. 5a shows a cross section view of inductive energy transmission coils and surroundings according to an example embodiment. A receiver coil 51 may be a coil of a device, for example, a mobile phone. The receiver coil 51 may be arranged to one side of the device such that there may be an opening 58 in the cover 56 of the device for the receiver coil 51. A receiver shield 54 may be arranged in parallel to the receiver coil 51 so that the receiver coil 51 is on top of the receiver shield 54. The receiver shield 54 remains on the side of the receiver coil 51 that is not arranged for inductive energy transmission. It is possible that both the receiver coil 51 and the receiver shield 54 are within the opening 58 of the cover 56. An additional shield 53 may be fixed to the cover 56, to the side of the cover 56 that is inside the apparatus. However, it is also possible that the additional shield 53 is not fixed to the cover 56, but the additional shield is fixed, for example, inside the device. There may also be a further additional shield 53' that is arranged, for example, on top of the receiver shield 54, receiver coil 51 and additional shield 53 when seen from the direction receive coil 51 is not arranged to receive inductive energy. The further additional shield 53' may be made from same material than the additional shield 53. However, it is also possible that there is more than one additional shield, for example, two or three. The amount of additional shields may depend on, for example, used components of the device and shielding material capabilities.

There may be a coating 50 i.e. a surface on the cover 56 and the receiver coil 51, the coating 50 may be any suitable material. In addition there may be a coating 57 i.e. a surface on the charger device on the side above the transmitter coil 52.

There may be air i.e. air gap 59 between the receiver coil 51 and transmitter coil 52. The transmitter coil 52 may be a coil of a charger i.e. a battery charging station. A transmit shield 55 may be arranged underneath the transmitter coil 52 when seen from the direction the transmitter coil 52 is arranged to transmit inductive energy to receive coil 52 i.e. the transmit shield 55 is on the side of the transmitter coil 52 that is not arranged for inductive energy transmission.

Figure 5B:
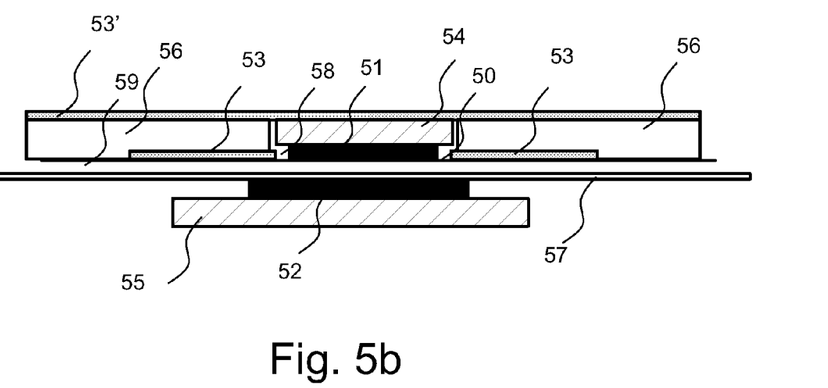
FIG. 5b shows a cross section view of inductive energy transferring coils and surroundings according to an example embodiment.

FIG. 5b shows a cross section view of inductive energy transmission coils and surroundings according to an example embodiment. In FIG. 5b, an additional shield 53 is fixed to the cover 56, so that when seen from the direction the receiver coil 51 is arranged to receive inductive energy from transmitter coil 52 the metal parts and components of the device are protected from inductive energy.

Figure 5C:
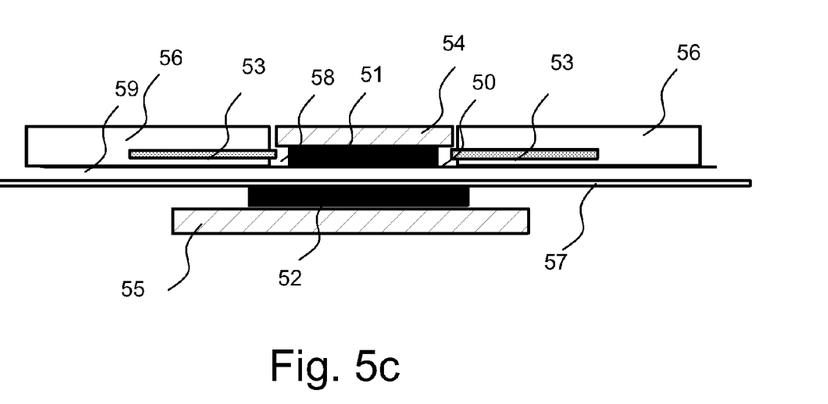
FIG. 5c shows a cross section view of inductive energy transferring coils and surroundings according to an example embodiment.

FIG. 5c shows a cross section view of inductive energy transmission coils and surroundings according to an example embodiment. An additional shield 53 is in-molded to the cover of a device for protecting the metal parts and components of the device from inductive energy.

Figure 6:
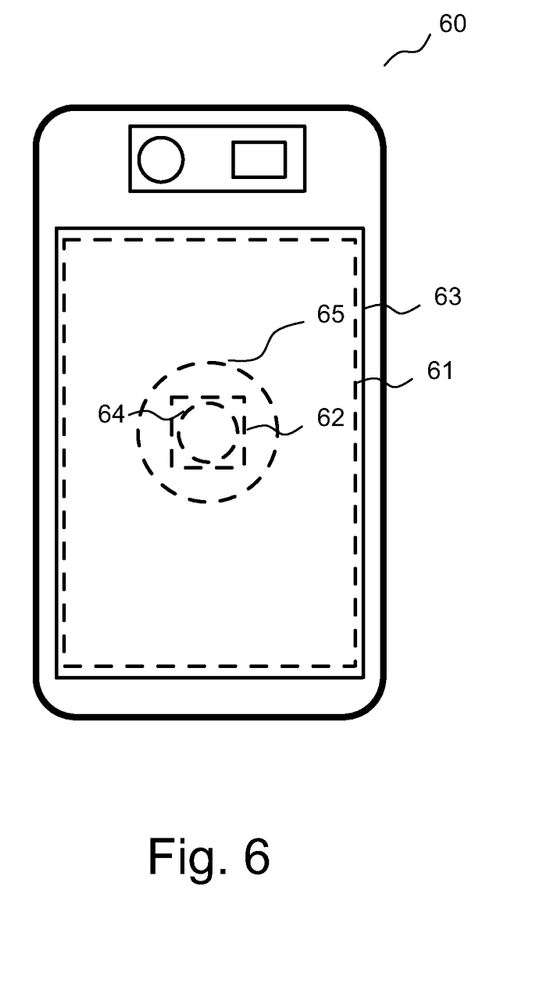
FIG. 6 shows a mobile phone with an additional shielding according to an example embodiment.

FIG. 6 shows a mobile phone 60 with an additional shield 61 with an opening 62 according to an embodiment in a rear view. The additional shield 61 disclosed by a dash line may have essentially the same size and shape as a battery cover 63 of the mobile phone 60. In FIG. 6, by dash lines are also disclosed an inductive energy receiver coil 64, a receiver shield 65 under the receiver coil 64 and the quadratic opening 62 of the additional shield 61 for the receiver coil 64. The receiver coil 64, shields 61, 65 and the cover 63 may be attached together, for example, by gluing or inmolding process.

Figure 7:
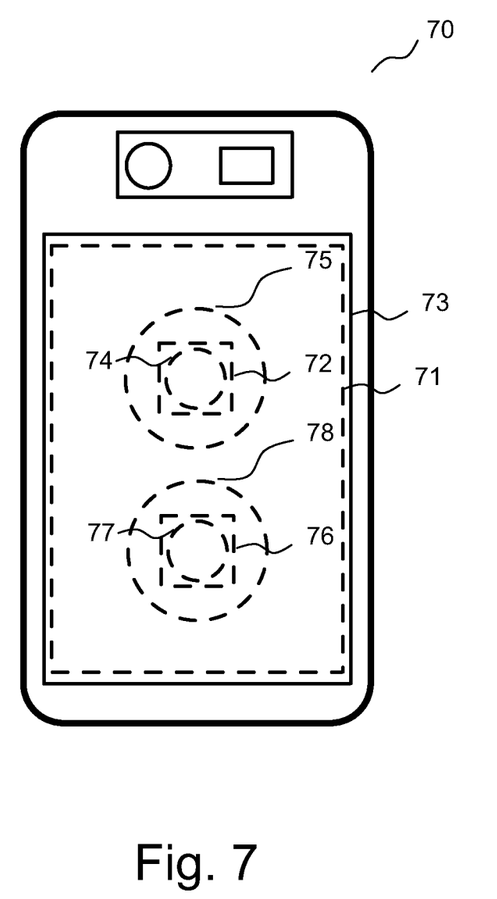
FIG. 7 shows a mobile phone with an additional shielding with two openings according to an example embodiment.

FIG. 7 shows in a rear view of a mobile phone 70 with an additional shield 71 comprising two openings 72, 76 according to an embodiment. The additional shield 71 disclosed by a dash line may have essentially the same size and shape as a battery cover 73 of the mobile phone 70. In FIG. 7, by dash lines are also disclosed a first inductive energy coil 74, a first receiver shield 75 under the first coil 74 and the first quadratic opening 72 of the additional shield 71 for the first coil 74 and a second inductive energy coil 77, a second receiver shield 78 under the second coil 77 and the second quadratic opening 76 of the additional shield 71 for the second coil 77. The first coil 74 may be, for example, a receiver coil and the second coil 77 may be a same kind of coil than the first coil 74 i.e. a receiver coil or the second coil 77 may be a different kind of coil than the first coil 74 i.e. for example, a transceiver coil or a transmitter coil. In addition, the amount of the openings and coils is not restricted, there may be more than two openings and coils.

It is possible that there is an additional shield also in the charging apparatus i.e. a charger, so that the additional shield protects metal parts and/or components also around the transmit shield from inductive energy. There may also be cooling elements or other applications behind the transmit shield. Shield of inductive energy coil and/or coils may be arranged so that the coil and/or coils is enabled for electromagnetic radiation i.e. coil and/or coils are enabled for inductive energy transmission. Coil and/or coils, shields, cover and possible different kind of coatings may be attached together, for example, by gluing or inmolding.

In addition, it is also possible that the receiver coil and/or the transmitter coil is a transceiver coil. It is also possible that there is more than one coil for inductive energy transmission in a device or in a charger, in which case, there may be more than one opening in additional shield and/or more than one additional shield for protecting components or material around the coils.

It is obvious that the present invention is not limited solely to the above-presented embodiments, but it can be modified within the scope of the appended claims.

The invention claimed is:

1. An apparatus comprising:
   an inductive energy coil configured for inductive energy transfer;
   a first shielding unit comprising an opening through the first shielding unit, wherein the first shielding unit is located in parallel to the inductive energy coil, and wherein the opening through the first shielding unit is arranged to be located so that the opening at least partially reveals the inductive energy coil electromagnetic radiation wherein a transmission or reception of the inductive energy coil electromagnetic radiation is enabled through the opening and is blocked by portions of the first shielding unit surrounding the opening, said opening allowing the electromagnetic radiation to be transmitted to or received from another inductive energy device; and
   a second shielding unit, wherein the second shielding unit is located in parallel to the inductive energy coil so that the inductive energy coil is enabled for transmission or reception of electromagnetic radiation.

2. The apparatus according to claim 1, wherein the inductive energy coil is an inductive energy receiver coil.

3. The apparatus according to claim 1, wherein the inductive energy coil is an inductive energy transmitter coil.

4. The apparatus according to claim 1, wherein the inductive energy coil is an inductive energy transceiver coil.

5. The apparatus according to claim 1, wherein the first shielding unit comprises a plurality of openings.

6. The apparatus according to claim 1, wherein the apparatus further comprises at least one further shielding unit with at least one opening, wherein the at least one further shielding unit is in parallel to the first shielding unit.

7. The apparatus according to claim 1, wherein the first shielding unit is in-molded into a cover of a device.

8. The apparatus according to claim 1, wherein the first shielding unit is attached to a cover of a device.

9. The apparatus according to claim 8, wherein the first shielding unit is attached to a back side of the cover of the device.

10. The apparatus according to claim 8, wherein the first shielding unit is attached to a front side of the cover of the device.

11. The apparatus according to claim 1, wherein the apparatus is a part of an electronic device.

12. A method comprising:
    locating, by an apparatus, a first shielding unit comprising an opening through the first shielding unit in parallel to an inductive energy coil, and wherein the opening through the first shielding unit is arranged to be located so that the opening at least partially reveals the inductive energy coil for electromagnetic radiation, wherein a transmission or reception of the inductive energy coil electromagnetic radiation is enabled through the opening and is blocked by portions of the first shielding unit surrounding the opening, said opening allowing the electromagnetic radiation to be transmitted to or received from another inductive energy device, and
    locating, by the apparatus, a second shielding unit in parallel to the inductive energy coil so that the inductive energy coil is enabled for a transmission or reception of electromagnetic radiation.

13. The method according to claim 12, wherein the inductive energy coil is an inductive energy receiver coil.

14. The method according to claim 12, wherein the inductive energy coil is an inductive energy transmitter coil.

15. The method according to claim 12, wherein the inductive energy coil is an inductive energy transceiver coil.

16. The method according to claim 12, wherein the first shielding unit has a plurality of openings.

17. The method according to claim 12, wherein the method further comprises locating, by the apparatus, at least one further shielding unit with at least one opening in parallel to the first shielding unit.

18. The method according to claim 12, wherein the method comprises in-molding, by the apparatus, the first shielding unit into a cover of a device.

19. The method according to claim 12, wherein the method comprises attaching, by the apparatus, the first shielding unit to a cover of a device.

20. The method according to claim 19, wherein the method comprises attaching, by the apparatus, the first shielding unit to a back side of the cover of the device.

* * * * *